Aug. 16, 1960 B. WU 2,949,579

TRANSISTOR AMPLIFIER WITH A.V.C.

Filed Dec. 27, 1957

INVENTOR.
BOSCO WU

BY George H. Fritzinger
Agt.

2,949,579

TRANSISTOR AMPLIFIER WITH A.V.C.

Bosco Wu, East Orange, N.J., assignor to McGraw-Edison Company, Elgin, Ill., a corporation of Delaware Filed Dec. 27, 1957, Ser. No. 705,667

6 Claims. (Cl. 330—13)

This invention relates to a transistor amplifier provided with a novel form of automatic volume control hereinafter referred to as A.V.C.

Amplifiers with A.V.C. are needed particularly in systems for recording dictation, especially conferences, because the volume range of the input signal encountered in such applications greatly exceeds the range in volume which can be recorded. For instance, a high gain is required to obtain satisfactory recording level when recording a speaker's voice at a considerable distance from the microphone, but a relatively low gain is desired when the voice is spoken directly into the microphone else overloading of the recording equipment will result. The present invention resides in a new form of A.V.C. system for transistorized amplifiers in which the A.V.C. action is obtained in a very effective and simple manner.

It is of course known that the gain of a transistor stage is decreased as the base-emitter bias voltage is decreased, but as far as is known the prior methods of reducing this bias with increasing output signal voltage have followed the technique common in vacuum tube amplifiers, which is to rectify and filter a voltage at the output of the amplifier and feed this D.C. control voltage back in series with a fixed bias provided in the voltage stage to be controlled. By the present invention however, a D.C. current is produced as a function of the A.C. output signal and is fed back through a bias resistor in the voltage gain stage. This is accomplished simply by feeding the A.C. output signal to an emitter of a common base transistor stage, which is unbiased so as to operate as a rectifier, and by connecting the collector-base circuit of this transistor through a resistor in the base-emitter circuit of the amplifier stage to be controlled. The action of the collector-base circuit of the A.V.C. transistor stage is to reduce the bias sharply in the amplifier stage as the output signal strength increases. This mode of obtaining a variation in the bias voltage with changes in signal level is accomplished by more simple means and with greater efficiency than has been possible by prior methods.

Objects of my invention are accordingly to provide a transistor amplifier with a simplified A.V.C. characterized as having a very sharp action, and particularly to provide a simple form of such A.V.C. in which a transistor connected in the feed back circuit in parallel with a bias resistor is operated in class B to provide a D.C. bias-control current through the resistor proportional to A.C. output signal.

These and other objects and features of my invention will be apparent from the following description and the appendent claims.

In the description of my invention reference is had to accompanying drawings, of which:

Figures 1, 2, 3, 4, 5:
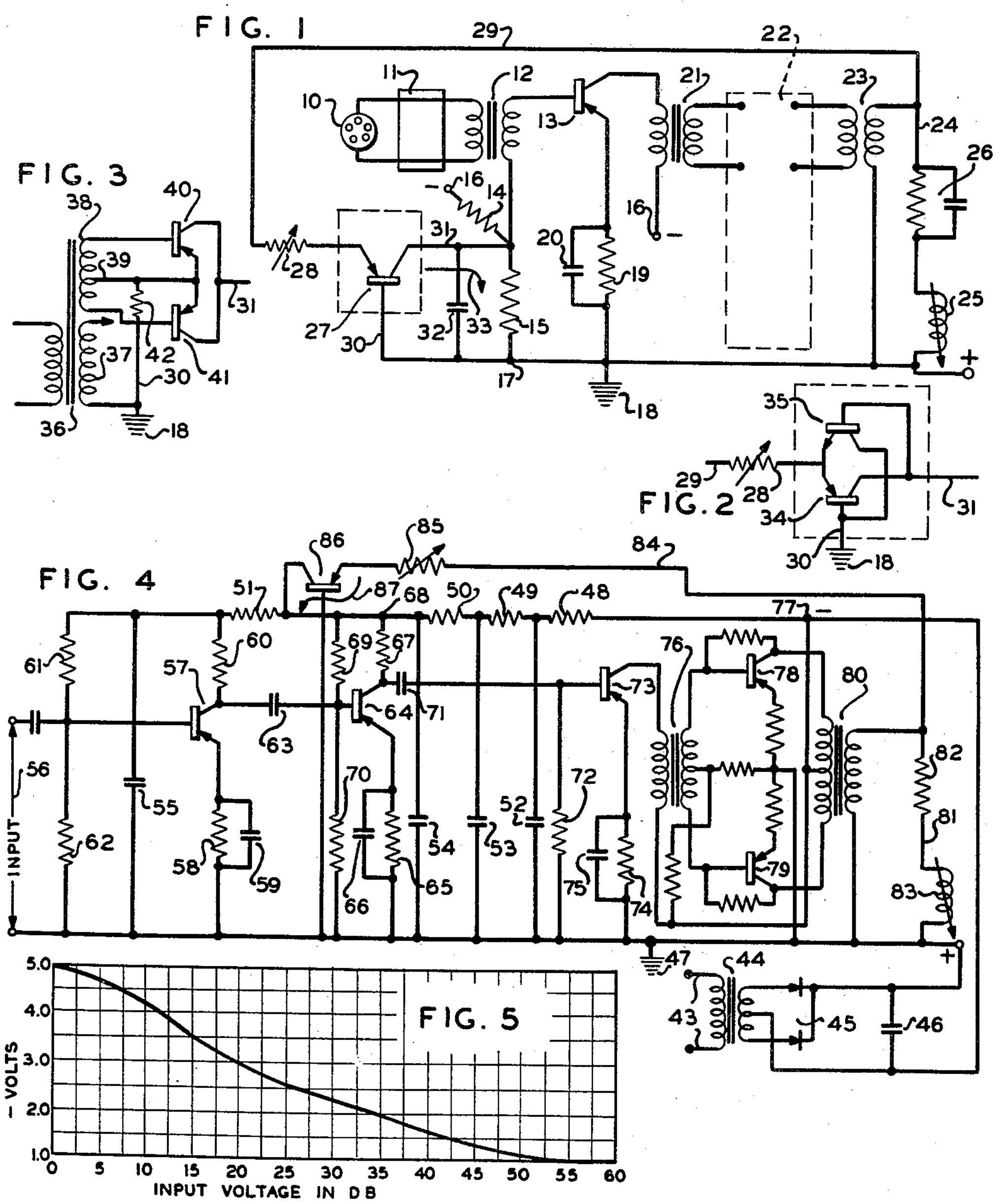
Figure 1 is a circuit diagram of a transistor amplifier having a transformer coupled gain stage with A.V.C. using a transistor in class B according to one embodiment of my invention.
Figure 2 is a partial circuit diagram showing a modified A.V.C. using complementary P.N.P. and N.P.N. transistors in full wave arrangement.
Figure 3 is another partial circuit diagram showing a modified A.V.C. using transistors in class B push-pull operation.
Figure 4 is an illustrative circuit diagram of a transistor amplifier for a dictating machine in which a plurality of RC coupled voltage gain transistor stages are operated with A.V.C. in accordance with my invention.
Figure 5 is a bias voltage-input level characteristic for the amplifier of Figure 4.

With reference to Figure 1, a microphone 10 is coupled as through any desired compensating network diagrammatically shown at 11 to an input transformer 12. The secondary of this transformer feeds into an emitter grounded transistor 13 herein considered for example as of the P.N.P. type. For class A operation, the base is biased negatively by a voltage divider circuit comprising resistors 14 and 15 connected serially from a negative terminal 16 of a fixed voltage source to a positive terminal 17 of this source grounded at 18. Thus, the base of the transistor 13 is connected through the secondary of the transformer 12 and through resistor 15 to ground. The emitter is connected through resistor 19 and condenser 20 in parallel to ground 18 and the collector is connected through the primary of an output transformer 21 to the negative voltage terminal 16. The secondary of the output transformer is connected through further voltage and power stages designated diagrammatically at 22 and thence through a power output transformer 23 to a load circuit 24 herein considered as serially including a recorder 25 and a compensating network 26.

In accordance with the present invention a very simple and effective means is provided for controlling the base-emitter bias voltage of the transistor 13 in accordance with the level of the output signal of the amplifier. For instance, a feed back circuit is used having therein a base grounded transistor 27 with its emitter connected through an adjustable resistor 28 and a lead wire 29 to the output load circuit 24 and with its base connected to ground by a lead wire 30. The collector of this transistor is connected by a lead wire 31 to the junction between the voltage divider resistors 14 and 15. Since the emitter has no bias the transistor 27 is operated class B to pass only the positive half cycles of the output signal. These positive half pulses are filtered in the collector circuit by a condenser 32 to provide therein an essentially D.C. current, indicated by the arrow 33, as a function of the A.C. output voltage. This D.C. current 33 is in the direction to reduce the base-emitter bias of the voltage amplifier transistor 13 as the A.C. output signal increases. For example, when no signal is fed into the amplifier the transistor 27 has such high collector resistance as to provide no appreciable shunt across the voltage divider resistor 15. As a signal of rising level is fed into the amplifier a substantial emitter current flows in the transistor 27 because such grounded base transistor is characterized as having a relatively low emitter resistance which however is still high compared to the low resistance output circuit 24 so as to provide no appreciable variable load on the output of the amplifier. A major fraction of the emitter current, typically about 95%, is transferred to the collector circuit of the transistor 27 to provide a sharp reduction in the bias of the amplifier transistor 13 with increase in output signal level. For example, it is found that the bias variation of the amplifier stage is such that the output-input ratio for this stage will shift from unity to a condition of substantially constant output over an input signal range of only 20 db and that the output level will thereupon remain substantially constant when the input signal increases through a further range of the order of 40 db.

The attack or rise time—which is the time required for the output level to stabilize when an input signal is suddenly impressed of a level sufficiently to effect full compression—is determined to a first order of approximation by the product of the effective resistance of the source of charging current for the condenser 32 through the transistor 27 and of the capacity of the condenser 32. These resistance and capacitance values are preferably selected so that the attack time is in the range between 10 and 30 ms. The decay or release time—which is the time for the condenser 32 to discharge after removal of an input signal of a level producing full compression—is determined by the product of the capacity of the condenser 32 and the effective parallel resistance of the divider circuit 14—15 and of the transistor 13 of the amplifier. The release time is set preferably at several seconds.

In Figure 2 there is shown an alternative form of dual transistor arrangement for use in place of the transistor 27 in the feed back circuit of Figure 1. This alternative arrangement comprises complementary P.N.P. transistor 34 and N.P.N. transistor 35 connected respectively with grounded base and grounded collector for class B operation. As so connected the transistors co-operate to provide full wave rectification of the input signal fed to the emitters.

In Figure 3 there is shown another alternative transistor arrangement for the feed back circuit, which is of the push-pull class B type. Here the amplifier is provided with a power output transformer 36 having one secondary winding 37 for connection to the load circuit 24 and a second output winding 38 provided with a center tap 39. The two half sections of the winding 38 feed respectively into transistors 40 and 41 connected in push-pull arrangement. For instance, the center tap is connected directly to the emitters of the two transistors, and is grounded through a resistor 42, and the outer terminals of the winding 38 are connected to the bases of these transistors. On the other hand the collectors are joined together and connected to the output lead 31.

In Figure 4 there is shown, by way of illustrative example, a complete transistor amplifier for a dictation recording machine. This amplifier has 3 RC coupled voltage stages the first two of which are under A.V.C. control in accordance with my invention. All transistors are connected with grounded emitters so as to have moderate input and output impedances. The D.C. voltage supply is derived from an A.C. power line 43 through a transformer 44 and a full-wave rectifier arrangement 45 feeding across a condenser 46. The positive side of this power supply is grounded at 47 and the negative side is connected to a four section RC filter comprising resistors 48, 49, 50 and 51 in series and condensers 52, 53, 54 and 55 in shunt.

The amplifier input terminals 56 are connected between ground and base of the first transistor 57 having a resistor 58 and condenser 59 in parallel in the emitter lead. The collector is biased negative by connecting it through a resistor 60 to the output terminal of the filtered negative power supply. Also the base is biased negative but to a lesser voltage by connecting it to the junction between resistors 61 and 62 connected also across the negative power supply. The collector of transistor 57 is connected through an inter-stage coupling condenser 63 to the base of a second transistor 64 having a resistor 65 and condenser 66 in parallel in its emitter lead. The collector is biased negative by connecting it through a resistor 67 to a junction 68 one section back from the output end of the filtered negative power supply. Also, the base is biased negative but to a lesser extent by connecting it to the junction between resistors 69 and 70 connected between the negative power supply at 68 and ground. The two transistors 57 and 64 are operated with A.V.C. as will appear.

The collector of the transistor 64 is connected through a coupling condenser 71 to a load resistor 72 and to the base of a transistor 73 having a resistor 74 and condenser 75 in parallel in its emitter circuit. The collector of this transistor is connected through a primary winding of a transformer 76 to a terminal 77 of the RC filter in the negative power supply. The secondary of this transformer is center tapped and connected to feed into two power transistors 78 and 79. Suffice to say that these transistors are connected in push-pull with grounded emitters and feed back for class A, B operation. The collectors are connected across a primary winding of an output transformer 80 the secondary winding of which is connected to a load circuit 81 serially including a resistor 82 and a low resistance winding of a recorder 83.

Figure 6:
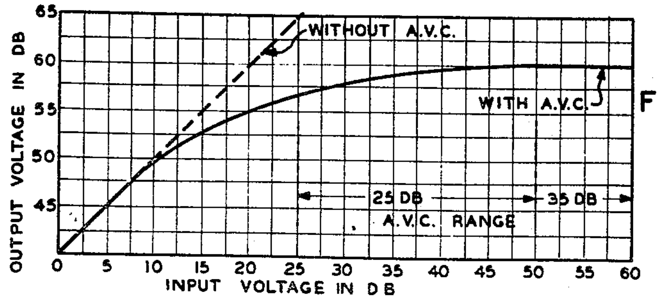
Figure 6 is an output-input characteristic for the amplifier of Figure 4.

The A.V.C. system comprises a feed back circuit 84 connected across the load circuit through a resistor 85 to an unbiased emitter of a grounded base transistor 86. The collector of this transistor is connected to the terminal 68 of the RC filter of the negative power supply. By way of example the unfiltered D.C. power supply may be minus 12 volts, the voltage at the terminal 68 a minus 5 volts and the voltage at the output of the RC filter a minus 3.5 volts in view of the poor regulation in the power supply circuit caused by the resistances of the filter sections and the load resistances of the voltage divider circuits 69—70, 61—62 and of the collectors of the transistors 57 and 64. When the amplifier has no signal output the A.V.C. transistor 86 provides no appreciable shunt resistance across the load resistances just mentioned. However, as the input voltage to the amplifier is increased from a zero db level ($2.25\times10^{-3}$ volts) to a level of 50 db, a unidirectional current 87 filtered by the condenser 54 is provided with increasing value in the collector circuit to decrease the bias voltage at the terminal 68 from minus 5 volts to minus 1 volt as shown by the graph of Figure 5. This decreasing bias voltage reduces the bias on both the collector and base of each of the transistors 57 and 64 to provide a sharp reduction in the gain of these stages as shown by the graph of Figure 6. The attack time is a composite of the RC product of the charge circuit for the condenser 55 via the resistor 51 and transistor 86 and of the RC product of the charge circuit for the condenser 54 via the transistor 86; and the release time is a composite of the RC products of the discharge circuits for these condensers via the respective voltage divider circuits and transistors, as before explained.

Only by way of illustrative example without intending any unnecessary limitation thereto, the resistances of the amplifier of Figure 4 designated by their reference characters may have the following values:

48, 2.7K; 49, 1K; 50, 3.3K; 51, 3.9K; 58, 4.7K; 60, 6.8K; 61, 18K; 62, 8.2K; 65, 2.7K; 67, 5.6K; 69, 27K; 70, 10K; 72, 10K; 74, 560 ohms; 82, 6.8 ohms; 83, 12 ohms; 85, 150 to 650 ohms. Furthermore, the condensers in the amplifier of Figure 4 referred to by their reference numbers may have the following values:

46, 1000 mfd.; 52, 25 mfd.; 53, 50 mfd.; 54, 80 mfd.; 55, 25 mfd.; 59, 25 mfd.; 63, 5 mfd.; 66, 25 mfd.; 71, 5 mfd.; 75, 80 mfd.

The particular embodiments of my invention herein particularly shown and described are intended to be illustrative and not limitative of my invention since the same are subject to changes and modifications without departure from the scope of my invention which I endeavor to express according to the following claims.

I claim:

1. An amplifier including a transistor stage having base, emitter and collector electrodes, a source of D.C. bias voltage having an internal resistance for poor voltage regulation, means connecting said source to the collector electrode of said transistor stage, a pair of resistors connected serially across said source, one of said resistors being included in the base-emitter circuit of said transistor stage to provide therein a bias for causing the transistor stage to operate as a class A amplifier, means for feeding an A.C. input signal into said base emitter circuit, and means to provide said transistor stage with A.V.C. comprising a common base transistor having base, emitter and collector electrodes and means for connecting its collector electrode to said source of bias voltage, the emitter base circuit of said common base transistor being unbiased to cause the same to operate as a rectifier, means for feeding A.C. output signals from said amplifier into said emitter base circuit of said common base transistor for causing said source of bias voltage to be reduced as the A.C. output signal of the amplifier is increased, and a filter condenser connected across said bias source.

2. An amplifier including a transistor amplifier stage having base, emitter and collector electrodes and means for providing a D.C. bias potential in the base-emitter circuit and a D.C. bias potential for the collector electrode to cause said stage to operate as a class A amplifier, said amplifier stage having a gain which is decreased as the bias potentials for said base-emitter circuit and for said collector electrode are reduced, means for feeding an A.C. input signal into said base-emitter circuit, an automatic volume control circuit including a common base transistor having a collector-base circuit coupled to said bias providing means and having its emitter-base circuit unbiased for Class B operation, and means for feeding the A.C. output signal from said amplifier to the emitter-base circuit of said common base transistor whereby to provide a direct current of variable magnitude in said bias providing means poled to reduce the bias potentials for said base-emitter circuit and for said collector electrode in proportion to the A.C. output signal voltage.

3. The amplifier set forth in claim 2 wherein said automatic volume control circuit includes complementary P.N.P.–N.P.N. transistors connected in class B full wave arrangement.

4. The amplifier set forth in claim 2 wherein said automatic volume control circuit includes two transistors of the same type connected in class B push-pull arrangement.

5. An amplifier including a transistor stage having base, emitter and collector electrodes, a source of D.C. bias voltage, a resistance type voltage divider circuit connected across said bias source, said divider circuit having first and second taps respectively of higher and lower bias voltages, a load resistor connected between said collector electrode and said first tap, a direct connection between said base electrode and said second tap, means for feeding an A.C. input signal into the base-emitter circuit of said transistor, and means for reducing the bias simultaneously on said base and collector electrodes as the output signal of the amplifier increases comprising a rectifier, and means for feeding an A.C. output signal from said amplifier through said rectifier to said first tap of said voltage divider circuit.

6. The amplifier set forth in claim 5 wherein said rectifier comprises a common base transistor having base, emitter and collector electrodes with the collector electrode connected to said first tap of said voltage divider circuit and the emitter-base circuit connected to the output circuit of the amplifier, said emitter-base circuit of said common base transistor being unbiased for class B operation.

References Cited in the file of this patent

UNITED STATES PATENTS

| | | |
|---|---|---|
| 1,992,774 | Ryall | Feb. 26, 1953 |
| 2,751,446 | Bopp | June 19, 1956 |
| 2,761,917 | Aronson | Sept. 4, 1956 |
| 2,762,873 | Goodrich | Sept. 11 ,1956 |
| 2,789,164 | Stanley | Apr. 16, 1957 |
| 2,848,603 | Schultz | Aug. 19, 1958 |

FOREIGN PATENTS

| | | |
|---|---|---|
| 120,308 | Sweden | Dec. 2, 1947 |

OTHER REFERENCES

Lo et al.: Text, "Transistor Electronics," September 1955, pages 82, 83.